(12) United States Patent
Ching et al.

(10) Patent No.: US 7,557,423 B2
(45) Date of Patent: Jul. 7, 2009

(54) SEMICONDUCTOR STRUCTURE WITH A DISCONTINUOUS MATERIAL DENSITY FOR REDUCING EDDY CURRENTS

(75) Inventors: Kai-Ming Ching, Jhudong Township, Hsinchu County (TW); Chen Chen-Shien, Zhubei (TW); Han-Hsiang Huang, Donggang Township, Pingtung County (TW); Chih-Hua Chen, Taipei (TW); Chen-Cheng Kuo, Chu-Pei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/850,647

(22) Filed: Sep. 5, 2007

(65) Prior Publication Data

US 2009/0057823 A1  Mar. 5, 2009

(51) Int. Cl.
  *H01L 23/48* (2006.01)
(52) U.S. Cl. ...................... 257/528; 257/531
(58) Field of Classification Search ............... 257/528, 257/531, 532, 737, 738
  See application file for complete search history.

(56) References Cited

U.S. PATENT DOCUMENTS 6,310,387 B1 * 10/2001 Seefeldt et al. .............. 257/531
6,833,603 B1 * 12/2004 Park et al. .................... 257/528

\* cited by examiner

*Primary Examiner*—Roy K Potter
(74) *Attorney, Agent, or Firm*—K & L Gates LLP

(57) ABSTRACT

A semiconductor structure includes an inductor; and a semiconductor substrate underlying the inductor, having a discontinuous material density across a plane underneath and in parallel with the inductor, thereby reducing eddy currents induced by an electrical current flowing through the inductor.

18 Claims, 12 Drawing Sheets

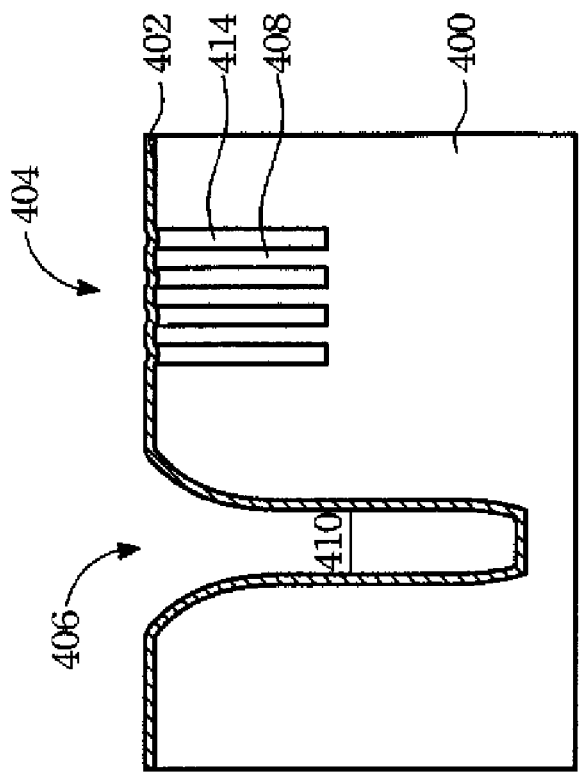
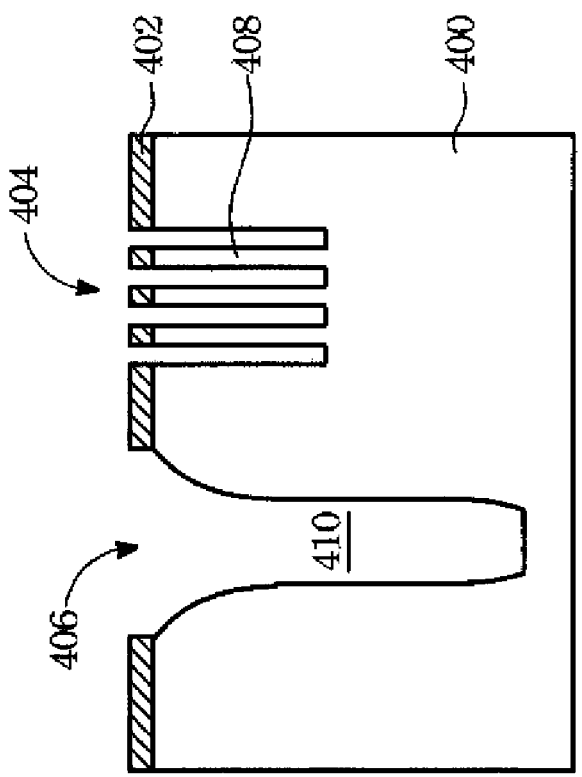
FIG. 4B
FIG. 4A

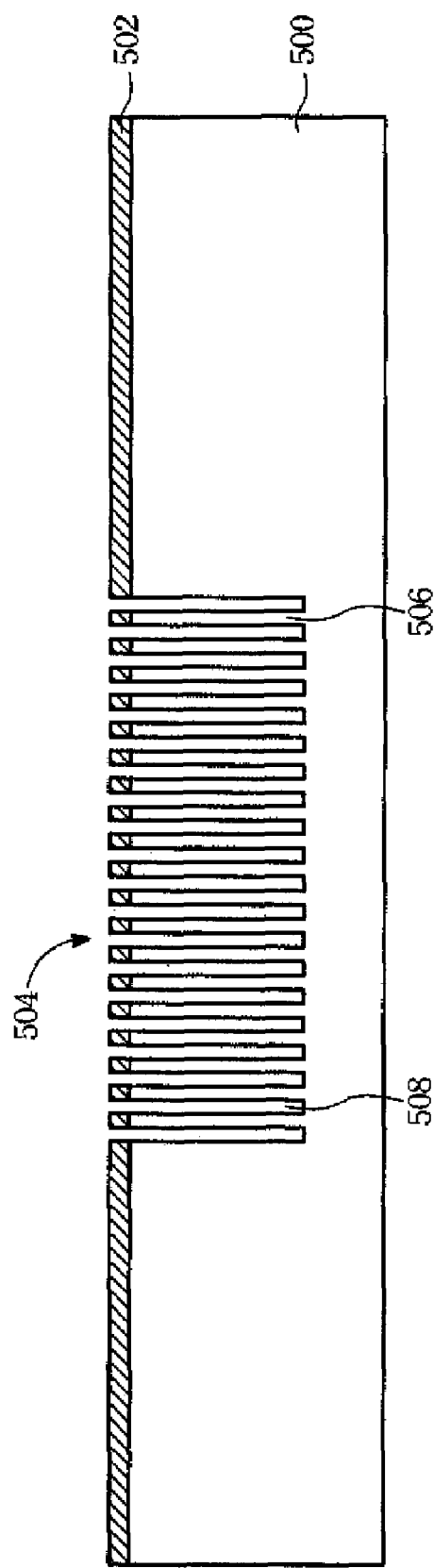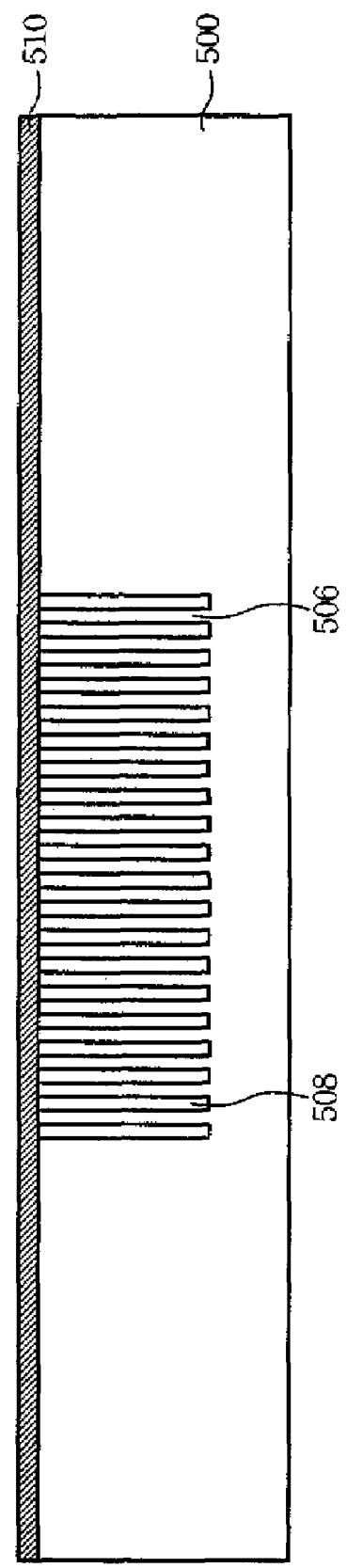

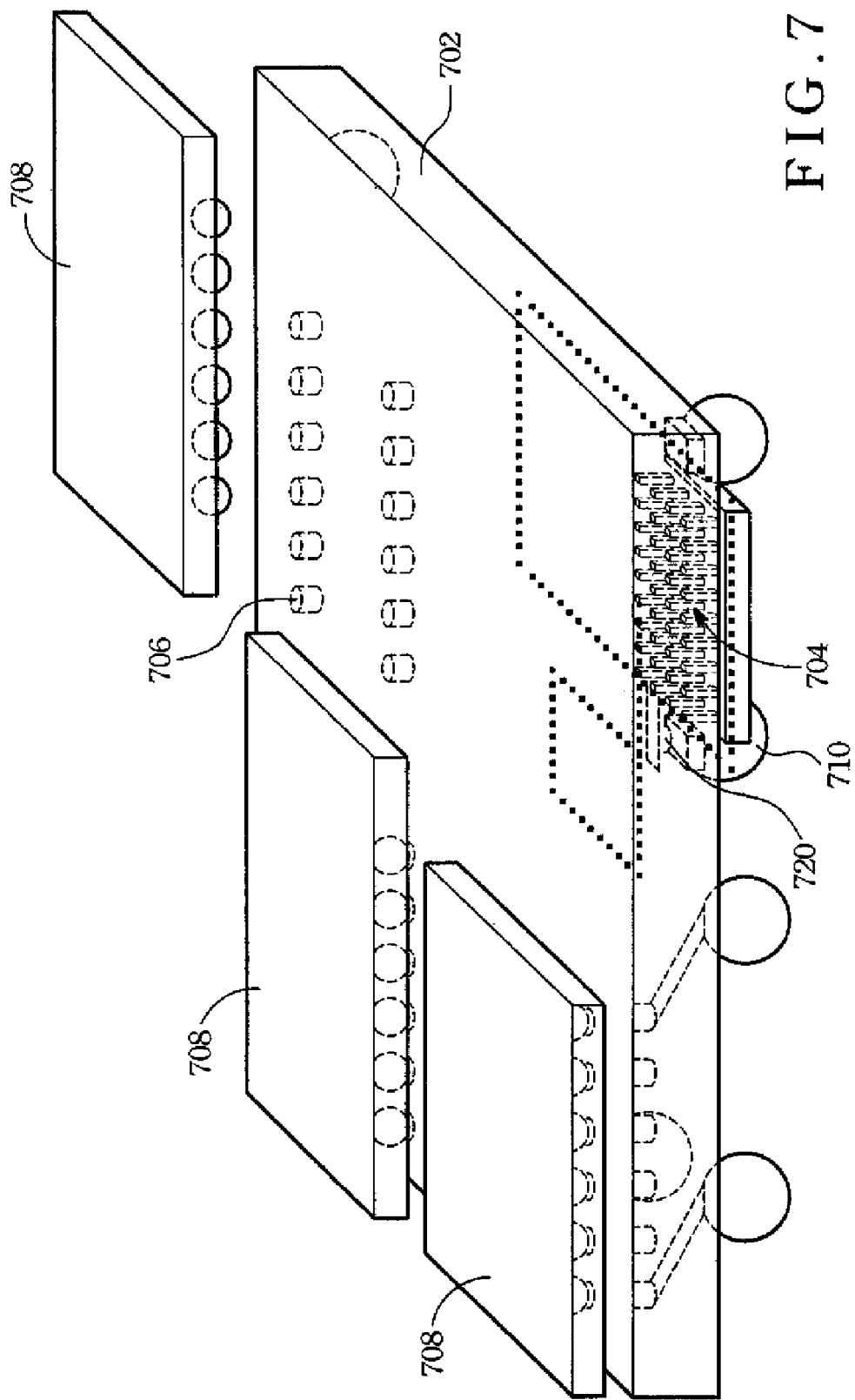

SEMICONDUCTOR STRUCTURE WITH A DISCONTINUOUS MATERIAL DENSITY FOR REDUCING EDDY CURRENTS

BACKGROUND

The present invention relates generally to integrated circuit (IC) designs, and more particularly to a semiconductor structure with a discontinuous material density for reducing eddy currents induced therein.

An eddy current is an electrical phenomenon caused by a moving magnetic field intersecting a conductor. It can occur in an IC chip, in which an inductor is placed on top of a semiconductor substrate. FIG. 1, for example, illustrates an inductor 100 placed above a semiconductor substrate 102. A magnetic field represented by magnetic flux 104 is induced by an electric current flowing through the inductor 100. The magnetic flux 104 cuts through the semiconductor substrate 102 underneath the inductor 100, and induces eddy currents 106 therein. The eddy currents 106 flowing in the semiconductor substrate 102 generates heat, and increases the power consumed by the inductor 104. Thus, it is desired that the induced eddy currents be reduced or eliminated.

Conventionally, the eddy currents 102 can be reduced by increasing the resistance of the semiconductor substrate 102. However, this approach may alter the electrical characteristics of the semiconductor substrate, thereby disturbing operations of the devices constructed on the substrate. Moreover, changing the resistance of the semiconductor substrate 102 requires additional processing steps. Thus, other solutions for reducing the induced eddy currents are needed.

SUMMARY

The present invention is directed to a semiconductor structure with a discontinuous material density for reducing eddy currents induced therein. In one embodiment of the present invention, a semiconductor structure is disclosed. It includes an inductor; and a semiconductor substrate underlying the inductor, having a discontinuous material density across a plane underneath and in parallel with the inductor, thereby reducing eddy currents induced by an electrical current flowing through the inductor.

In another embodiment, the semiconductor structure includes a semiconductor substrate; an inductor constructed on the semiconductor substrate; and a capacitor constructed on the semiconductor substrate. The semiconductor substrate has an array of semiconductor pillars separated by elongated vias underlying the inductor for adjusting material density of the semiconductor substrate across a plane in parallel with the inductor, thereby reducing eddy currents induced by an electrical current flowing through the inductor.

The construction and method of operation of the invention, however, together with additional objectives and advantages thereof will be best understood from the following description of specific embodiments when read in connection with the accompanying drawings.

BRIEF DESCRIPTION OF THE DRAWINGS

FIGS. 4A and 4B illustrate a number of cross-sectional views showing a process flow of making the proposed semiconductor structure in accordance with another embodiment of the present invention.

FIGS. 5A-5H illustrates a number of cross-sectional views showing a process flow of making the proposed semiconductor structure in accordance with yet another embodiment of the present invention.

FIG. 7 illustrates a semiconductor structure constructed as an interposer between an IC chip and a printed circuit board in accordance with yet another embodiment of the present invention.

DESCRIPTION

This invention describes a semiconductor structure that reduces eddy currents for improving power efficiency. The following merely illustrates various embodiments of the present invention for purposes of explaining the principles thereof. It is understood that those skilled in the art will be able to devise various equivalents that, although not explicitly described herein, embody the principles of this invention.

Figure 2:
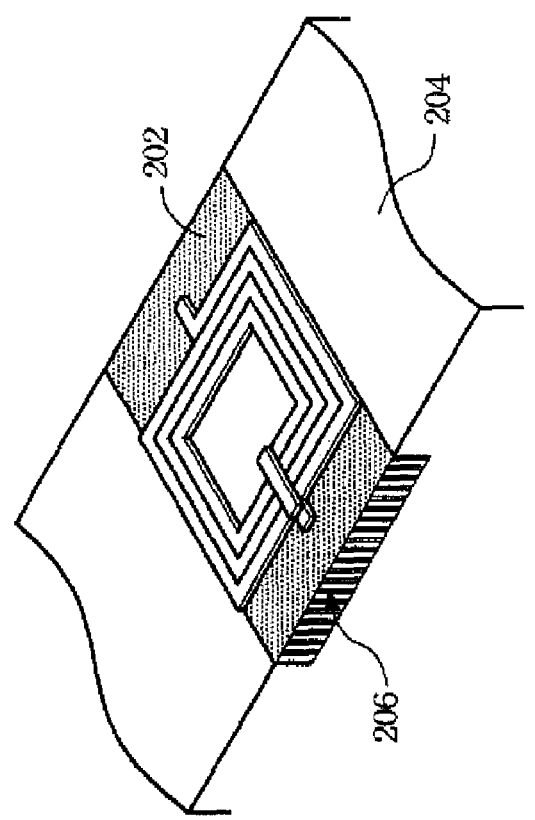
FIG. 2 illustrates an inductor placed on top of a semiconductor substrate with a discontinuous material density in accordance with one embodiment of the present invention.

FIG. 2 illustrates an inductor 202 placed on top of a semiconductor substrate 204 with discontinuous material density across a plane in parallel with the inductor 202 in accordance with one embodiment of the present invention. The inductor 202 is constructed by a spiral-shaped conductive layer overlying the semiconductor substrate 204 where it is selectively etched to form an array of semiconductor pillars 206 separated by a plurality of elongated vias. When an electrical current flows through the inductor 202, eddy currents are induced in the semiconductor substrate underlying the inductor. These eddy currents flow in either a clockwise or a counterclockwise direction in the semiconductor substrate, on planes in parallel with the inductor 202. Because the semiconductor substrate 204 underlying the inductor 202 is constructed by an array of semiconductor pillars 206 separated by elongated vias, the eddy currents induced by the inductor 202 in the semiconductor substrate 202 are reduced. This, in turn, reduces the power consumption of the inductor 202.

The semiconductor substrate 204 can be made of silicon, germanium, or a combination thereof. It may be a conventional semiconductor substrate on which ICs are constructed, a semiconductor on insulator, or an interposer placed between IC chips and a printed circuit board. The processing steps of making the proposed semiconductor substrate are described in the following.

Figure 1:
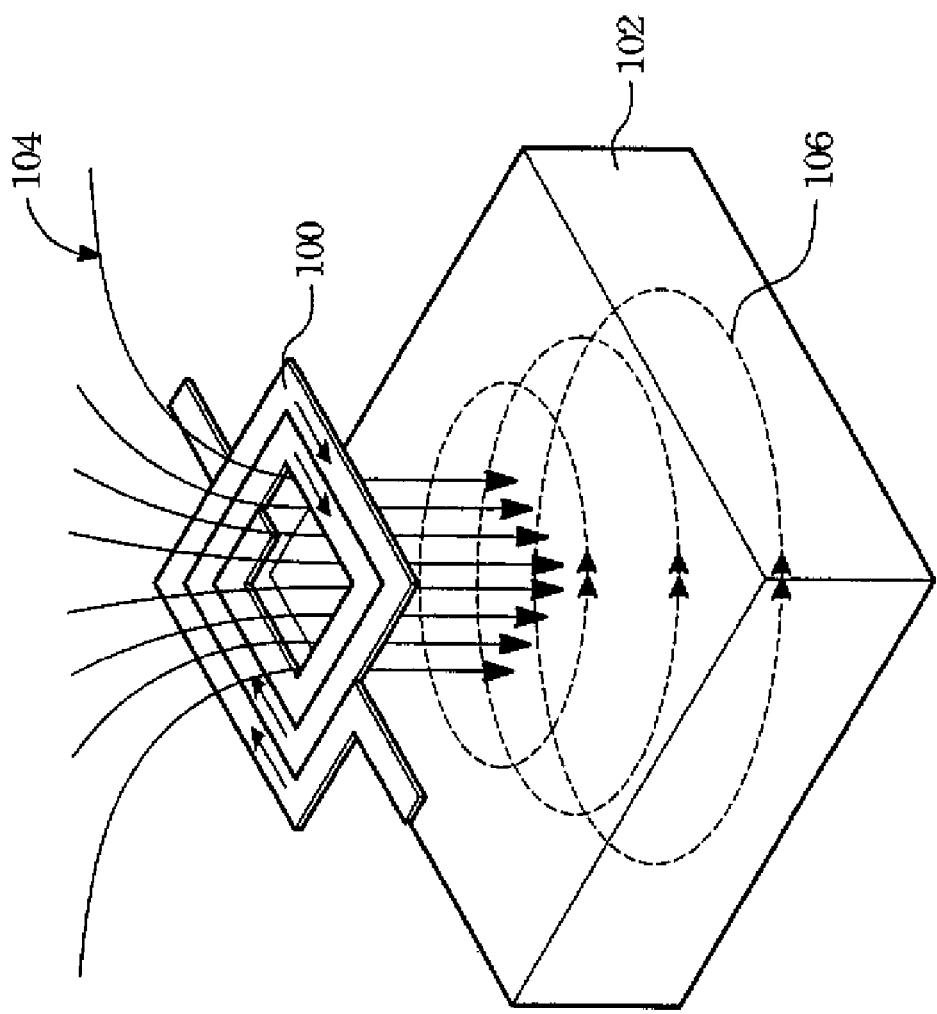
FIG. 1 illustrates an inductor inducing eddy currents in its underlying semiconductor substrate.
Figure 3A:
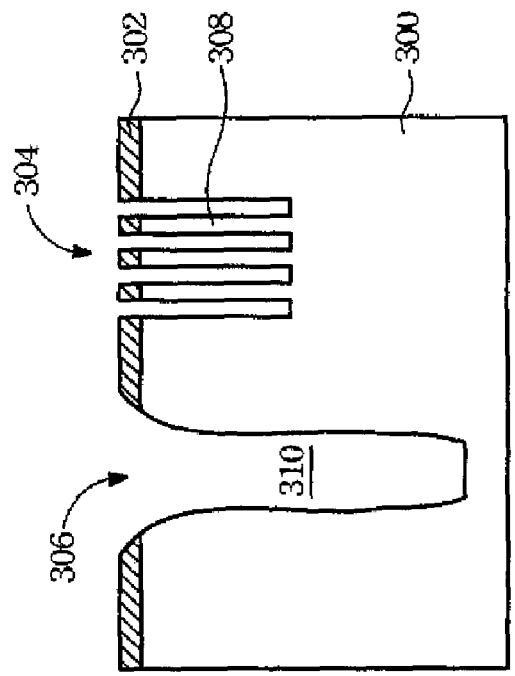
FIGS. 3A-3C illustrate a number of cross-sectional views showing a process flow of making the proposed semiconductor structure in accordance with one embodiment of the present invention.
Figure 3C:
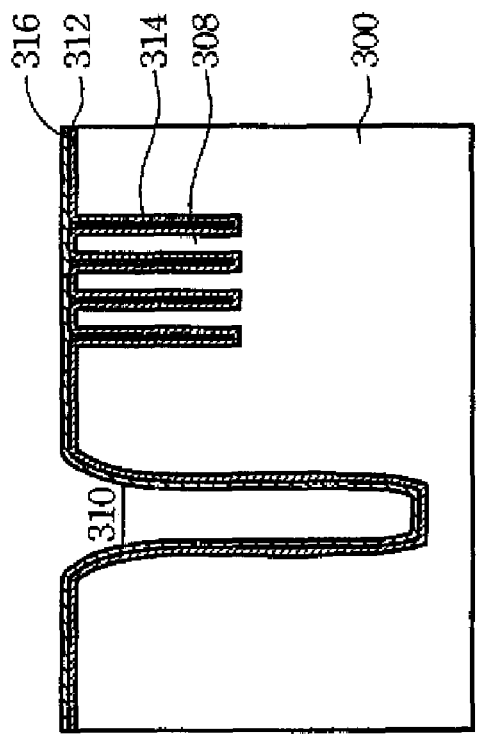
Figure 3B:
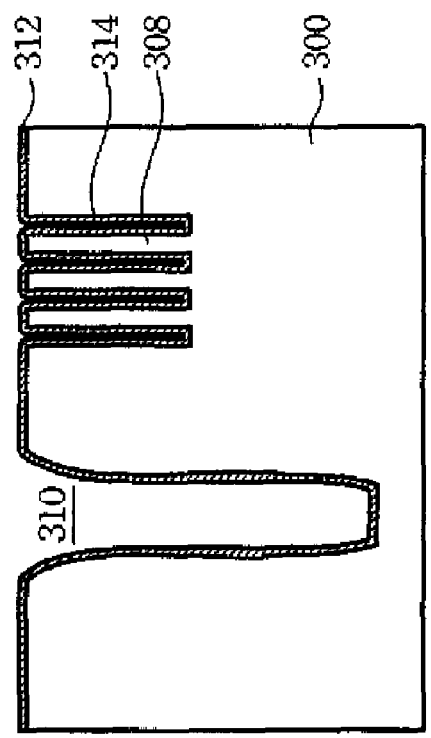

FIGS. 3A-3C illustrate a number of cross-sectional views showing a process flow of making the proposed semiconductor structure in accordance with one embodiment of the present invention. Referring to FIG. 3A, a photoresist layer 302 with a plurality of openings is disposed on a semiconductor substrate 300. A first set of openings 304 are spaced with a fine resolution in an area above which an inductor (not shown in this figure) is to be made. A second opening 306 with a larger width is formed adjacent to the first set of openings 304 for defining a through substrate via (TSV) 310 for connecting IC chips to solder balls on a printed circuit board. An etching step is performed to remove parts of the semiconductor substrate 300 that are exposed by the openings 304 and 306, thereby forming the semiconductor pillars 308 and the TSC 310. Thereafter, the photoresist layer 302 is removed.

Referring to FIGS. 3B and 3C, the semiconductor substrate 300 is thermally treated to grow an oxide layer on the surface thereof to further narrow the width of the elongated vias 314 separating the semiconductor pillars 308. A dielectric layer 316 is deposited on top of the oxide layer 312. As shown in FIG. 3C, because the width of the vias 314 are sufficiently narrow, instead of filling in the elongated vias 314, the depositing dielectric materials would seal the elongated vias 314 at the top. In this embodiment, the semiconductor pillars 308 have a depth ranging approximately between 10 and 100 μm, and a width less than about 5 μm, whereas the TSV 310 has a depth ranging approximately between 20 and 300 μm, and a width ranging approximately between 2 and 50 μm.

In this embodiment, the semiconductor pillars 308 are separated by the elongated vias 314. However, it is understood that the elongated vias 314 can be filled by dielectric materials, which can also reduce the eddy currents in the semiconductor substrate 300. It is also noted that, in this embodiment, the TSV 310 is used to form a contact for connecting an IC chip to a number of solder balls on a printed circuit board in the case where the semiconductor substrate 300 is an interposer. However, it is also noted that the TVS 310 is not a necessary element in forming the semiconductor structure, and the semiconductor substrate 300 can be used to construct ICs thereupon.

FIGS. 4A and 4B illustrate a number of cross-sectional views showing a process flow of making the proposed semiconductor structure in accordance with another embodiment of the present invention. Referring to FIG. 4A, a photoresist layer 402 with a number of openings is disposed on a semiconductor substrate 400. A first set of openings 404 are spaced with a fine resolution in an area above which an inductor (not shown in this figure) is to be made. A second opening 406 with a larger width is formed adjacent to the first set of openings 404 for defining a TSV 410. An etching step is performed to remove parts of the semiconductor substrate 400 that are exposed by the openings 404 and 406, thereby forming the semiconductor pillars 408. Thereafter, the photoresist layer 402 is removed.

Referring to FIG. 4B, a dielectric layer 402 is deposited directly on the surface of the semiconductor substrate 400, without performing an oxidation step first. Because the widths of the elongated vias 414 separating the semiconductor pillars 408 are sufficiently narrow, instead of filling in the elongated vias 414, the depositing dielectric materials would seal the elongated vias 414 at the top.

In this embodiment, the semiconductor pillars 408 are separated by the elongated vias 414. However, it is understood that these elongated vias 414 can be filled by dielectric materials, which can also reduce the induced eddy currents in the semiconductor substrate 400. It is also noted that, in this embodiment, the TSV 410 is used to form a contact for connecting an IC chip to a number of solder balls on a printed circuit board in the case where the semiconductor substrate 400 is an interposer. However, it is also noted that the TVS 410 is not a necessary element in forming the semiconductor structure, and the semiconductor substrate 400 can be used to construct ICs thereupon.

Figure 5C:
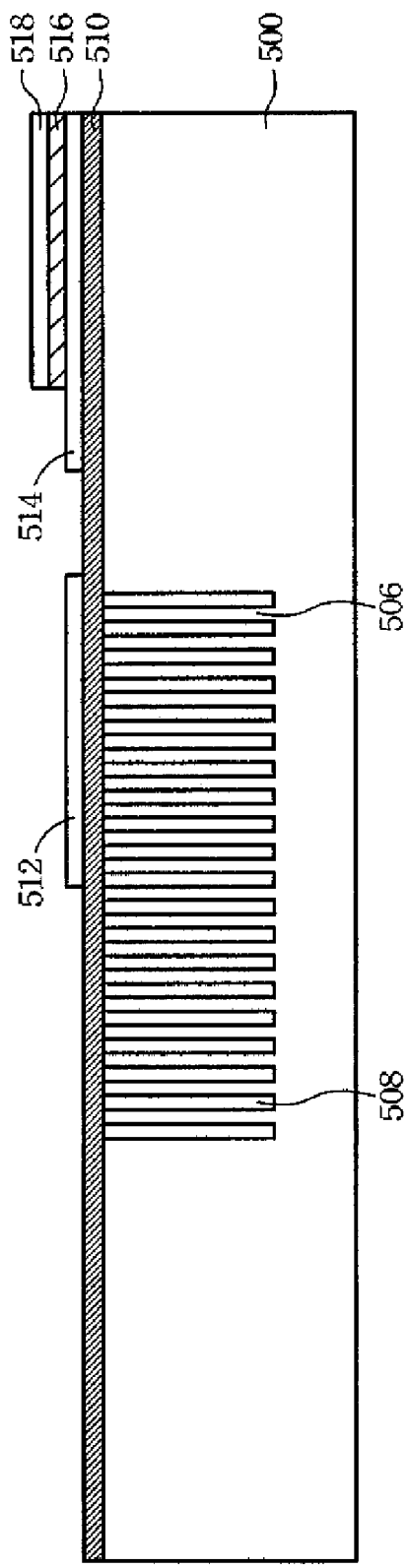

FIGS. 5A-5H illustrate a number of cross-sectional views showing a process flow of making the proposed semiconductor structure that includes at least an inductor and a capacitor in accordance with yet another embodiment of the present invention. FIG. 5A shows a semiconductor substrate 500, on which a photoresist layer 502 is disposed. The semiconductor substrate 500 can be made of silicon, germanium, or a combination thereof. The photoresist layer 502 has a plurality of openings 504 closely placed together with each other. An etching step is performed using the photoresist layer 502 as a mask to remove the semiconductor substrate 500 exposed by the openings 504, and form an array of semiconductor pillars 506 separated by a plurality of elongated vias 508. Thereafter, the photoresist layer 502 is removed to prepare the semiconductor substrate 500 for subsequent process steps.

Referring to FIG. 5B, a dielectric layer 510 is formed over the semiconductor pillars 506 and the elongated vias 508 on the semiconductor substrate 500. Specifically, the dielectric layer 510 can be a layer of silicon oxide formed on the semiconductor substrate 500 by methods, such as chemical vapor deposition (CVD). In this embodiment, the width of the elongated vias 508 is sufficiently narrow, such that the dielectric layer 510 can seal the elongated vias 508, and provide a flat surface at the top of the semiconductor pillars 506.

Alternatively, an oxidation step can be performed to form an oxide coating on sidewalls of the semiconductor pillars 506 before the dielectric layer 510 is deposited. This can further narrow the width of the elongated vias 508, and therefore allow the dielectric layer 510 to be formed on the semiconductor substrate 500 more easily.

Referring to FIG. 5C, a first conductive layer, a dielectric layer, and a second conductive layer are formed and patterned to form a conductive bridge 512, a first electrode 514, an insulation layer 516, and a second electrode 518 on the dielectric layer 510. The conductive bridge 512, first electrode 514 and second electrode 518 can be made of materials such as copper, aluminum, etc., and by process steps, such as sputtering and CVD. The insulation layers 516 can be made of materials such as silicon oxide, silicon nitride and silicon oxynitride. The first electrode 514, the insulation layer 516 and the second electrode 518 together function as a capacitor.

Figure 5D:
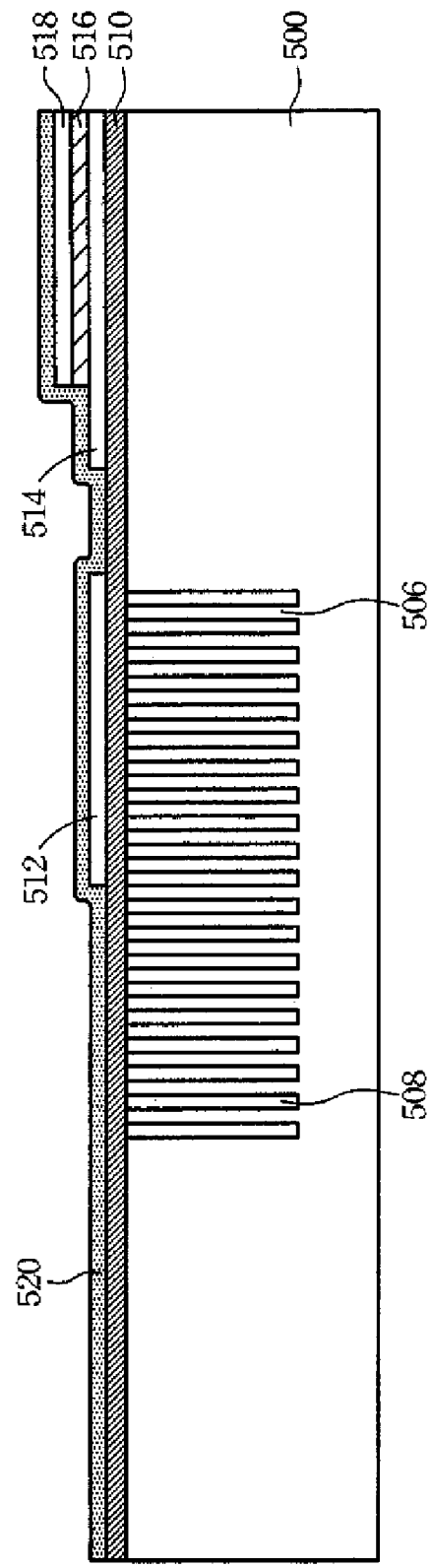
Figure 5E:
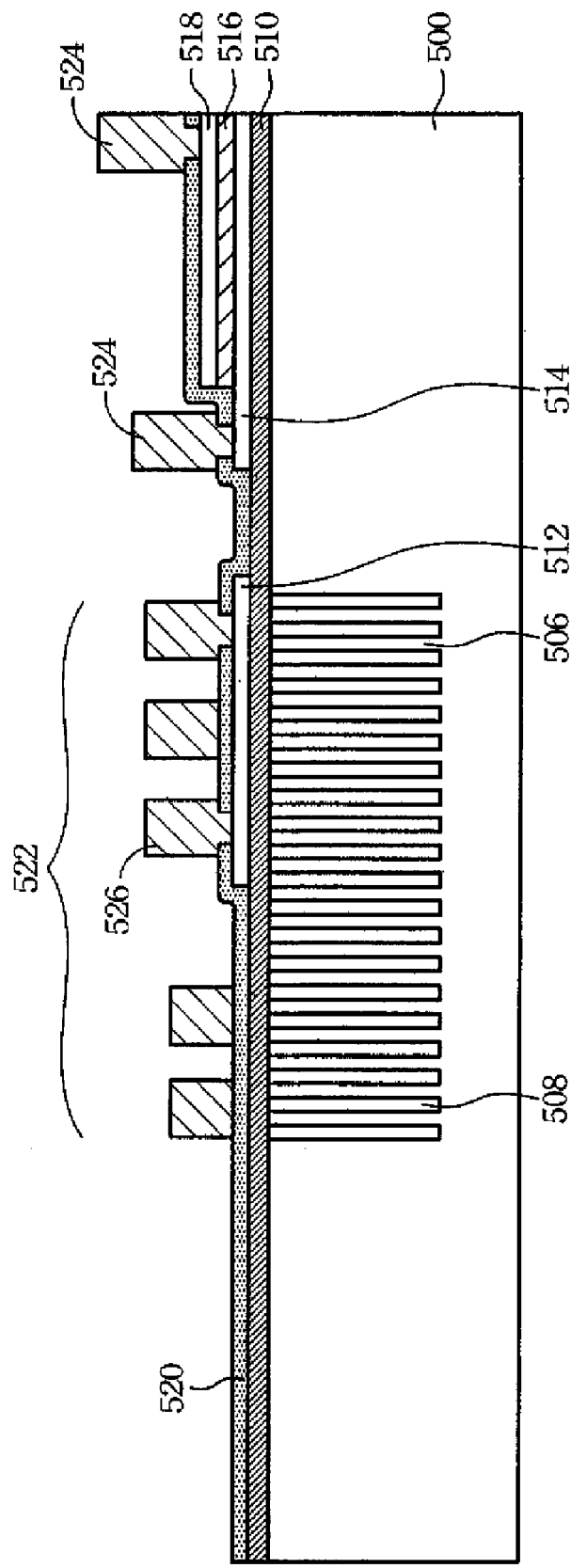

Referring to FIG. 5D, an inter-metal dielectric layer 520 is formed over the conductive bridge 512, the first electrode 514, the insulation layer 516 and the second electrode 518. As shown in FIG. 5E, the inter-metal dielectric layer 520 is patterned to form vias down to the first electrode 514, the second electrode 518 and the conductive bridge 512 in the inter-metal dielectric layer 520. A seed layer (not shown in the drawing) is formed on the inter-metal dielectric layer 520 and the vias therein. A photolithography process and an electro-plating process are performed sequentially to from an inductor 522 overlying the semiconductor pillars 506, and contacts 524 on the first and second electrodes 514 and 518. The inductor 522 is essentially a spiral-shaped conductive layer 526 with two ends connected by the conductive bridge 512. It is noted that although the conductive layer 526 is illustrated as a number of isolated blocks overlying the semiconductor pillars 506, in a three-dimensional view, these blocks are cross-sections of a continuous, spiral band.

Figure 5F:
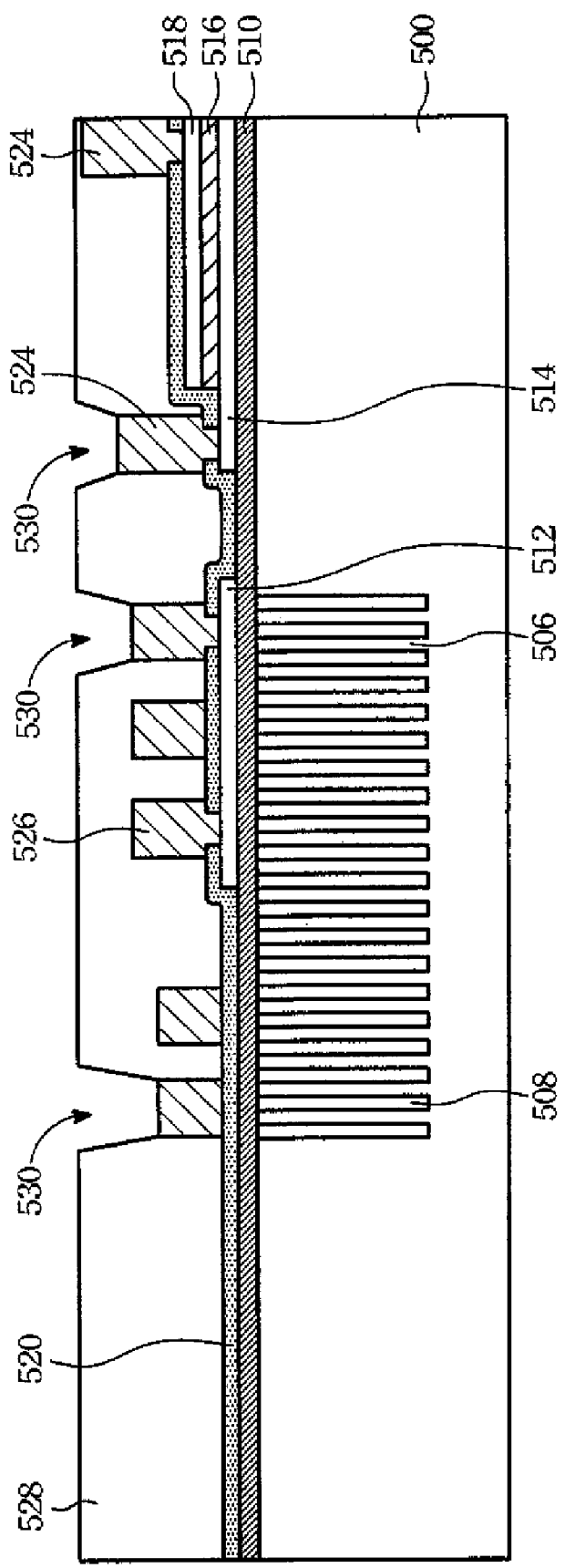
Figure 5G:
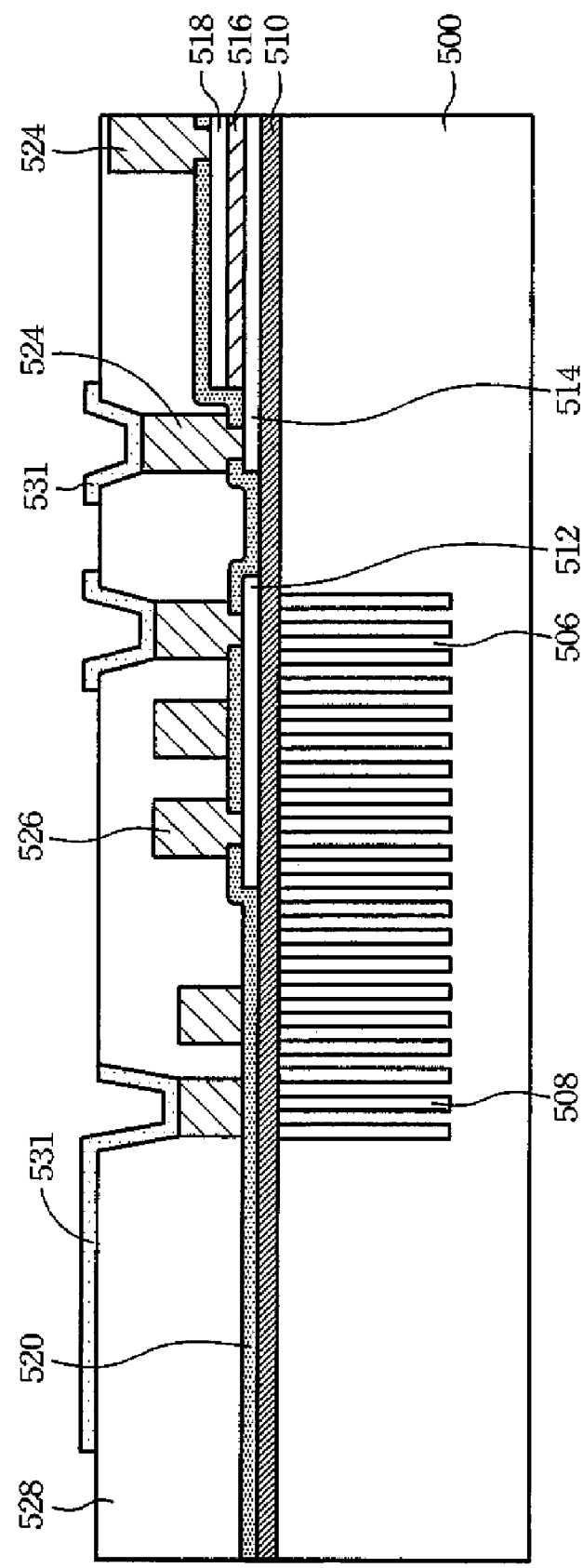
Figure 5H:
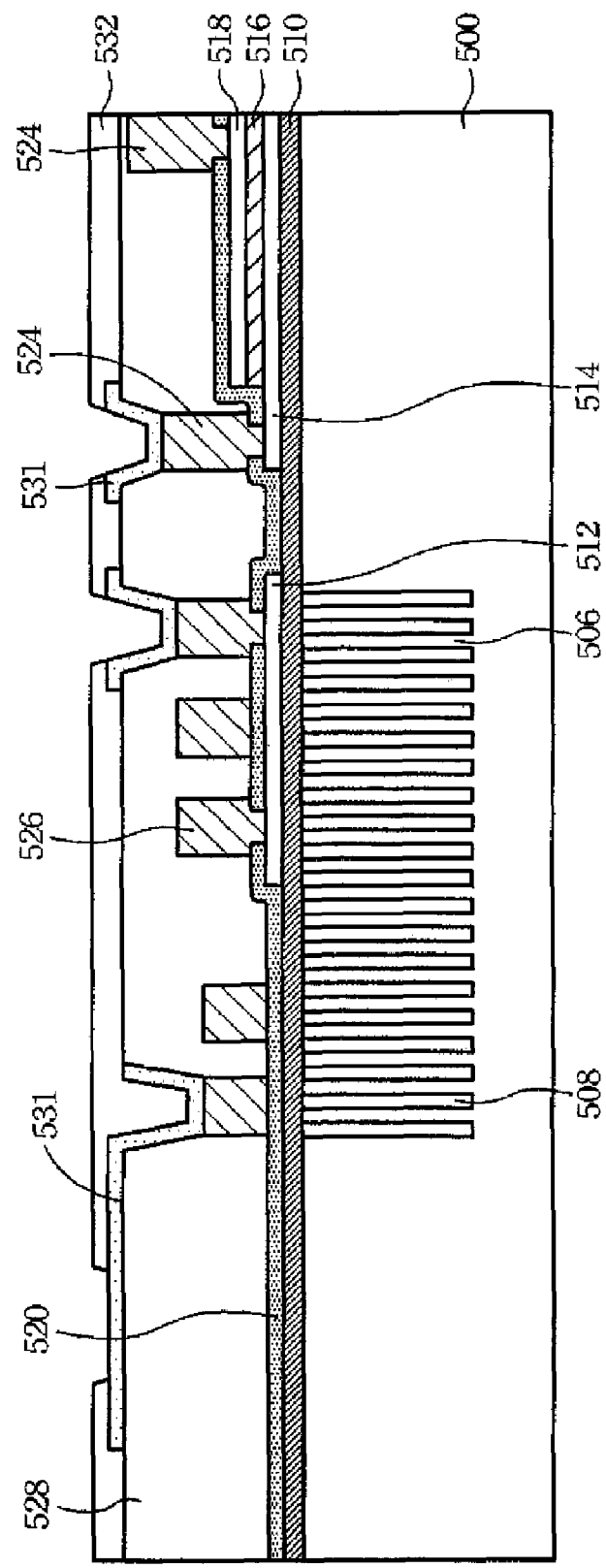

A dielectric layer 528 is formed over the contacts 524 and the spiral-shaped conductive layer 526. Vias 530 are formed in the dielectric layer 528 to expose parts of the spiral-shaped conductive layer 526 and the contact 524, as shown in FIG. 5F. A number of contacts 531 are formed on the contact 524 and the spiral-shaped conductive layer 526 in the vias 530, as shown in FIG. 5G. Another dielectric layer 532 is deposited on the dielectric layer 528 to expose appropriate portions of the contacts 531, so as to allow the first electrode 514, the second electrode 518, and the inductor 522 to be accessed electrically from the outside. As discussed above, the semiconductor pillars 506 reduce eddy currents induced by the inductor 522, and therefore lower the power consumption of the same.

Figure 6:
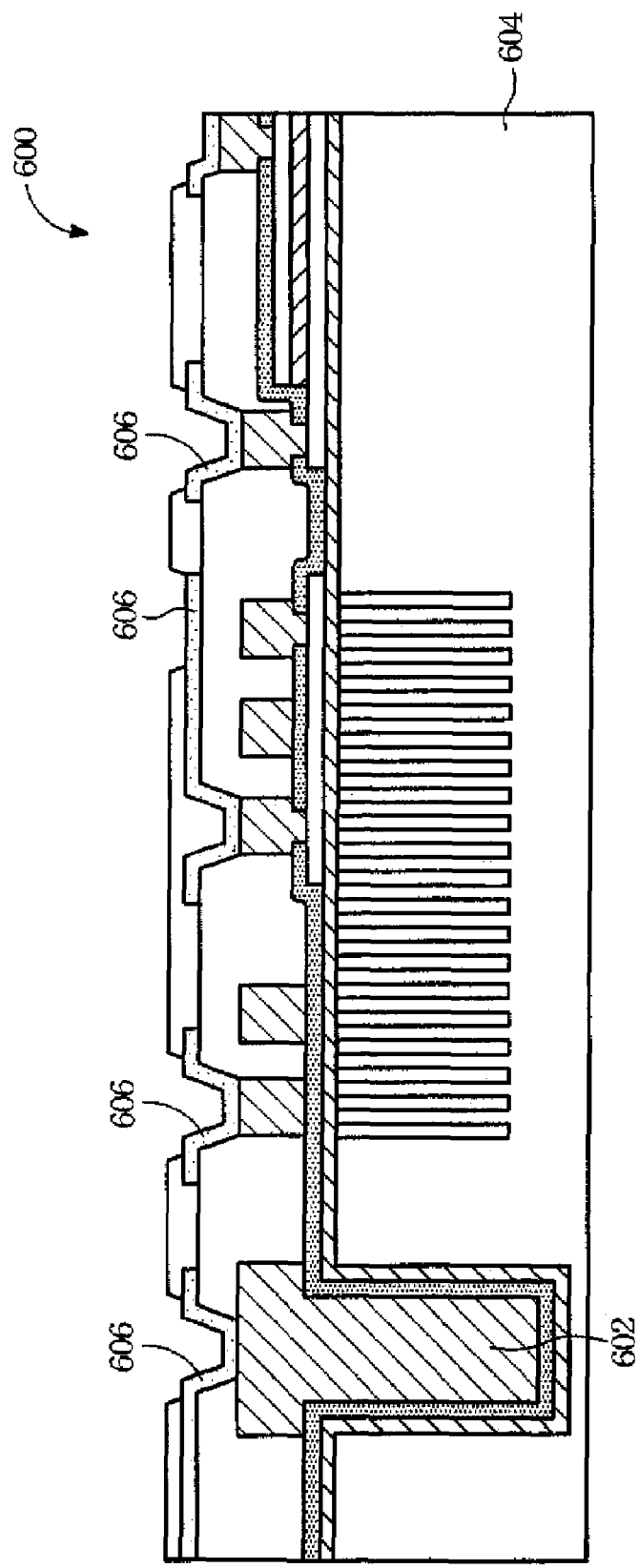
FIG. 6 illustrates a cross-sectional view of the proposed semiconductor structure in accordance with yet another embodiment of the present invention.

FIG. 6 illustrates a cross-sectional view of the proposed semiconductor structure 600 in accordance with yet another embodiment of the present invention. The semiconductor structure 600 is similar to the structure shown in FIG. 5H except for the TSV contact 602 constructed in the semiconductor substrate 604. In this embodiment, the semiconductor substrate can be an interposer, in which the TSV contact connects IC chips through contacts 606 to solder balls on a printed circuit board. As shown in FIG. 7, the interposer 702 has an array of semiconductor pillars 704 in it. On the top surface of the interposer 702, a number of pads 706 are provided for connecting to one or more IC chips 708. On the bottom side of the interposer, a TSV contact 720 is provided for connecting the IC chips 708 mounted thereon to a number of solder balls 710 to be further connected to a printed circuit board (not shown in the figure).

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A semiconductor structure comprising:
an inductor; and
a semiconductor substrate underlying the inductor, and having a discontinuous material density across a plane underneath and in parallel with the inductor, thereby reducing eddy currents induced by an electrical current flowing through the inductor, wherein the semiconductor substrate is an interposer placed between an integrate circuit chip and a number of solder balls coupling the integrated circuit chip to a printed circuit board.

2. The semiconductor structure of claim 1, wherein the semiconductor substrate comprises an array of semiconductor pillars underlying the inductor.

3. The semiconductor structure of claim 2 comprising a first dielectric layer overlying the semiconductor pillars.

4. The semiconductor structure of claim 3 comprising a second dielectric layer coated on sidewalls of the semiconductor pillars.

5. The semiconductor structure of claim 2, wherein the semiconductor pillars have a depth between 10 and 100 μm.

6. The semiconductor structure of claim 2, wherein the semiconductor pillars have a width less than 5 μm.

7. The semiconductor structure of claim 1, wherein the interposer comprises a through substrate via filled with conductive materials for electrically connecting the integrated circuit chip to the solder balls.

8. The semiconductor structure comprising:
a semiconductor substrate;
an inductor constructed on the semiconductor substrate; and
a capacitor constructed on the semiconductor substrate,
wherein the semiconductor substrate has an array of semiconductor pillars separated by elongated vias underlying the inductor for adjusting material density of the semiconductor substrate across a plane in parallel with the inductor, thereby reducing eddy currents induced by an electrical current flowing through the inductor.

9. The semiconductor structure of claim 8, wherein the semiconductor pillars have a depth between 10 and 100 μm.

10. The semiconductor structure of claim 8, wherein the semiconductor pillars have a width less than 5 μm.

11. The semiconductor structure of claim 8 comprising a first dielectric layer overlying the semiconductor pillars.

12. The semiconductor structure of claim 8 comprising a second dielectric layer coated on sidewalls of the semiconductor pillars.

13. The semiconductor structure of claim 8, wherein the capacitor comprises:
a first electrode;
an insulation layer disposed on the first electrode; and
a second electrode disposed on the insulation layer.

14. The semiconductor structure of claim 8, wherein the inductor is constructed by a spiral-shaped conductive layer on the first dielectric layer overlying the semiconductor pillars.

15. The semiconductor structure of claim 8, wherein the semiconductor substrate is an interposer placed between an integrate circuit chip and a number of solder balls coupling the integrated circuit chip to a printed circuit board.

16. The semiconductor structure of claim 15 further comprising a through substrate via filled with conductive materials in the semiconductor substrate for electrically connecting the integrated circuit to the solder balls.

17. The semiconductor structure of claim 16, wherein the through substrate via has a depth approximately between 20 and 300 μm.

18. The semiconductor structure of claim 17, wherein the through substrate via has a width approximately between 2 and 50 μm.

* * * * *